(12) United States Patent
Lee

(10) Patent No.: US 11,795,544 B2
(45) Date of Patent: Oct. 24, 2023

(54) CARRIER RING USED IN A DEPOSITION CHAMBER

(71) Applicant: United Semiconductor (Xiamen) Co., Ltd., Fujian (CN)

(72) Inventor: Min-Fu Lee, Tainan (TW)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 94 days.

(21) Appl. No.: 17/516,727

(22) Filed: Nov. 2, 2021

(65) Prior Publication Data

US 2022/0056582 A1 Feb. 24, 2022

Related U.S. Application Data

(63) Continuation of application No. 16/679,255, filed on Nov. 10, 2019, now abandoned.

(30) Foreign Application Priority Data

Oct. 25, 2019 (CN) .......................... 201911021514.4

(51) Int. Cl.
| | |
|---|---|
| C23C 16/458 | (2006.01) |
| H01L 21/687 | (2006.01) |
| C23C 16/46 | (2006.01) |
| C23C 16/50 | (2006.01) |

(52) U.S. Cl.
CPC .......... *C23C 16/4585* (2013.01); *C23C 16/46* (2013.01); *C23C 16/50* (2013.01); *H01L 21/68735* (2013.01)

(58) Field of Classification Search
CPC ..... C23C 16/46; C23C 16/4585; C23C 16/50; H01L 21/68735
See application file for complete search history.

(56) References Cited

U.S. PATENT DOCUMENTS

| | | |
|---|---|---|
| 2003/0019584 A1 | 1/2003 | Choi |
| 2007/0215279 A1 | 9/2007 | Koshiishi |
| 2009/0087560 A1 | 4/2009 | Arai |
| 2013/0168020 A1* | 7/2013 | Hashiguchi ....... H01J 37/32642 156/345.51 |
| 2018/0135172 A1 | 5/2018 | Nogami |
| 2019/0259647 A1 | 8/2019 | Thirunavukarasu |

FOREIGN PATENT DOCUMENTS

CN 110114866 A 8/2019

* cited by examiner

*Primary Examiner* — Yuechuan Yu
(74) *Attorney, Agent, or Firm* — Winston Hsu

(57) ABSTRACT

A chamber for processing deposition on a wafer includes a wafer holder having a central surface region for placing a wafer and a carrier ring support surface encircling the central surface region; and a carrier ring disposed on the carrier ring support surface. The carrier ring comprises an annular disk body comprising an annular wafer support region, an annular peripheral region, and an annular transition region between the annular wafer support region and the annular peripheral region. The annular peripheral region comprises a top carrier ring surface. The annular wafer support region has a lower carrier ring surface that is in physical contact with a wafer during processing. The annular transition region comprises a curved slope between the top carrier ring surface and the lower carrier ring surface.

6 Claims, 4 Drawing Sheets

CARRIER RING USED IN A DEPOSITION CHAMBER

CROSS REFERENCE TO RELATED APPLICATIONS

This application is a continuation of U.S. application Ser. No. 16/679,255 filed on Nov. 10, 2019, the disclosure of which is incorporated in its entirety herein by reference.

BACKGROUND OF THE INVENTION

1. Field of the Invention

The present invention relates to the field of semiconductor technology, and in particular to a carrier ring used in a deposition chamber, which can improve edge local defect problems and improve semiconductor process yield.

2. Description of the Prior Art

Plasma Enhanced Chemical Vapor Deposition (PECVD) is a process by which thin films of various materials can be deposited on wafers at lower temperature than that of standard Chemical Vapor Deposition (CVD). In PECVD processes, deposition is achieved by introducing reactant gases between parallel electrodes—a grounded electrode and an RF-energized electrode. The capacitive coupling between the electrodes excites the reactant gases into plasma, which induces a chemical reaction and results in the reaction product being deposited on the wafer.

It is known that in some PECVD models (for example, the Vector series of Lam Research Co.), a carrier ring is placed around the wafer holder. The carrier ring and a spider fork enable the wafer to move smoothly between different deposition chambers. However, on the surface of the carrier ring, near the edge of the wafer, by-products of the deposition reaction are easily generated, resulting in edge local defects.

SUMMARY OF THE INVENTION

One object of the present invention is to provide an improved carrier ring for use in a deposition chamber that can alleviate the deficiencies and shortcomings of the prior art described above.

According to one aspect of the invention, a chamber for processing deposition on a wafer includes a wafer holder having a central surface region for placing a wafer and a carrier ring support surface encircling the central surface region; and a carrier ring disposed on the carrier ring support surface. The carrier ring comprises an annular disk body comprising an annular wafer support region, an annular peripheral region, and an annular transition region between the annular wafer support region and the annular peripheral region. The annular peripheral region comprises a top carrier ring surface. The annular wafer support region has a lower carrier ring surface that is in physical contact with a wafer during processing. The annular transition region comprises a curved slope between the top carrier ring surface and the lower carrier ring surface. The entire curved slope is lower than a top surface of the wafer.

According to some embodiments, the curved slope downwardly inclines from the top carrier ring surface toward the lower carrier ring surface.

According to some embodiments, the carrier ring support surface is a step down from the central surface region.

According to some embodiments, a step height is disposed between the curved slope and the lower carrier ring surface.

According to some embodiments, the annular transition region has a thickness that increases with a radius of the annular disk body.

According to some embodiments, the carrier ring further comprises a sidewall surface between the curved slope and the lower carrier ring surface.

According to some embodiments, a slit is situated between the sidewall surface and a peripheral edge of the wafer during processing.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient details to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
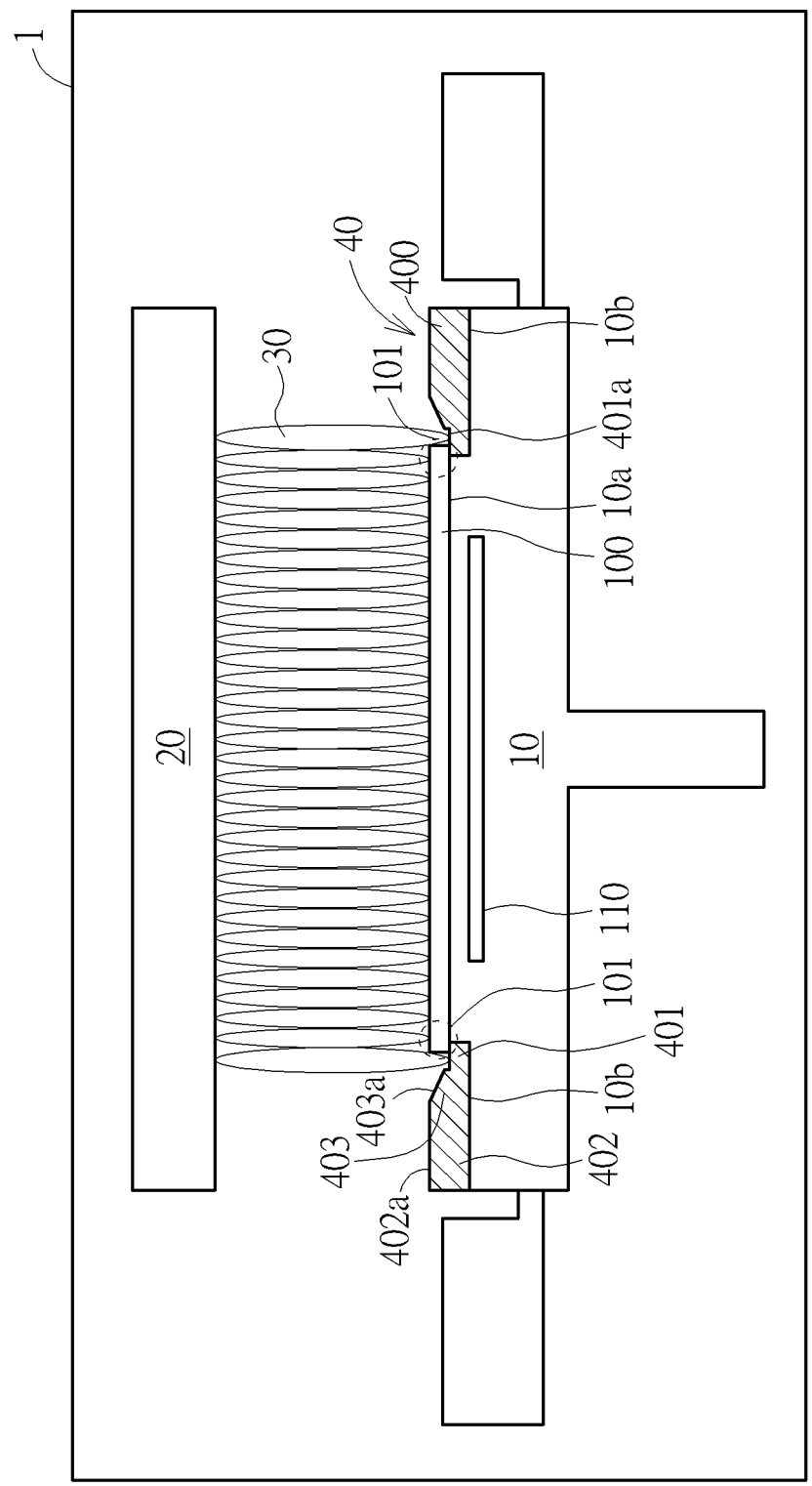
FIG. 1 is a schematic diagram of a chamber for performing deposition processing on a wafer according to an embodiment of the invention.

Please refer to FIG. 1, which is a schematic diagram of a chamber for performing deposition processing on a wafer according to an embodiment of the invention. As shown in FIG. 1, the chamber 1 is, for example, a deposition chamber in a plasma enhanced chemical vapor deposition (PECVD) tool. The chamber 1 comprises a wafer holder 10 having a central surface region 10a for placing a wafer 100, and a carrier ring support surface 10b surrounding the central surface area 10a. According to an embodiment of the invention, the carrier ring support surface 10b is lowered by one step from the central surface area 10a.

According to an embodiment of the present invention, the central surface region 10a may be an approximately circular and raised region, and the central surface region 10a has an area slightly smaller than the area of the wafer 100 such that when the wafer 100 is placed on the central surface region 10a, the bevel edge region 101 thereof slightly extends beyond the central surface region 10a. In addition, a heater plate 110 or other components may be disposed within the wafer holder 10 in accordance with embodiments of the present invention. According to an embodiment of the invention, an index plate may be additionally disposed around the wafer holder 10.

According to an embodiment of the present invention, a showerhead 20 may be disposed above the wafer holder 10 in the chamber 1 to directly face the wafer 100, which may be coupled to the gas inlet system or the manifold to allow the reaction gas to flow into the chamber 1. Additionally, the showerhead 20 can be coupled to a power source (not shown) to provide the voltage or bias required to generate the plasma 30. A reactive gas such as silane, oxygen or ammonia is used to form plasma 30 between the showerhead 20 and the wafer 100, and a reaction product such as silicon oxide or silicon nitride is deposited on the wafer 100.

To simplify the description, peripheral devices such as the gas inlet system or manifold, a gas supply line, and a control module coupled to the chamber 1 are not shown in the figures. Those skilled in the art will appreciate that the above-described configurations are merely illustrative and that the present invention can be applied in a variety of different configurations.

According to an embodiment of the present invention, a carrier ring 40 is disposed on the carrier ring support surface 10b, wherein the carrier ring 40 includes an annular disk body 400, wherein the annular disk body 400 may be composed of a material that does not participate in a deposition reaction, such as aluminum oxidation, but not limited to this. According to an embodiment of the invention, the annular disk body 400 can be divided into an annular wafer support region 401, an annular peripheral region 402, and an annular transition region 403 between the annular wafer support region 401 and the annular peripheral regions 402.

In accordance with an embodiment of the invention, the annular peripheral region 402 includes a top carrier ring surface 402a and the annular wafer support region 401 has a lower carrier ring surface 401a that is in direct contact with the wafer 100 during processing. In accordance with an embodiment of the invention, the annular transition region 403 comprises a slope 403a between the top carrier ring surface 402a and the lower carrier ring surface 401a. According to an embodiment of the invention, the slope 403a may be a flat surface that is not parallel to the top carrier ring surface 402a.

Figure 2:
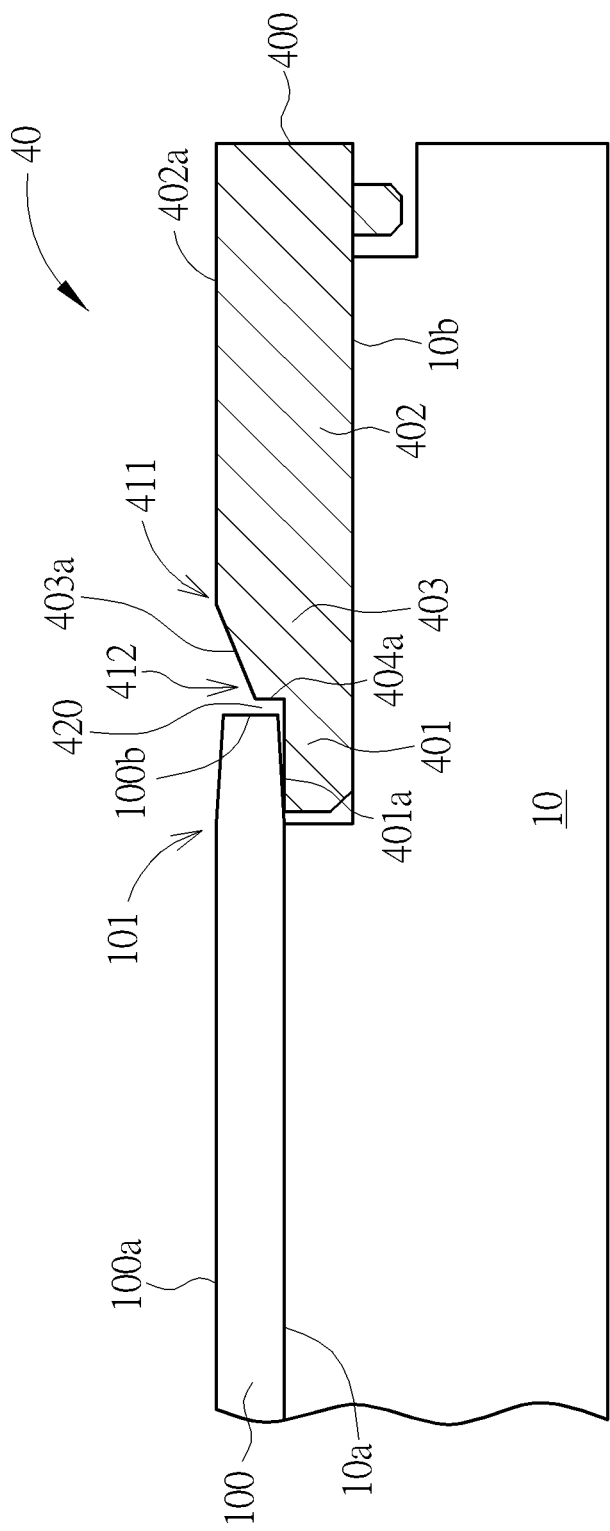
FIG. 2 is an enlarged schematic view of the carrier ring placed on the carrier ring support surface.
Figure 3:
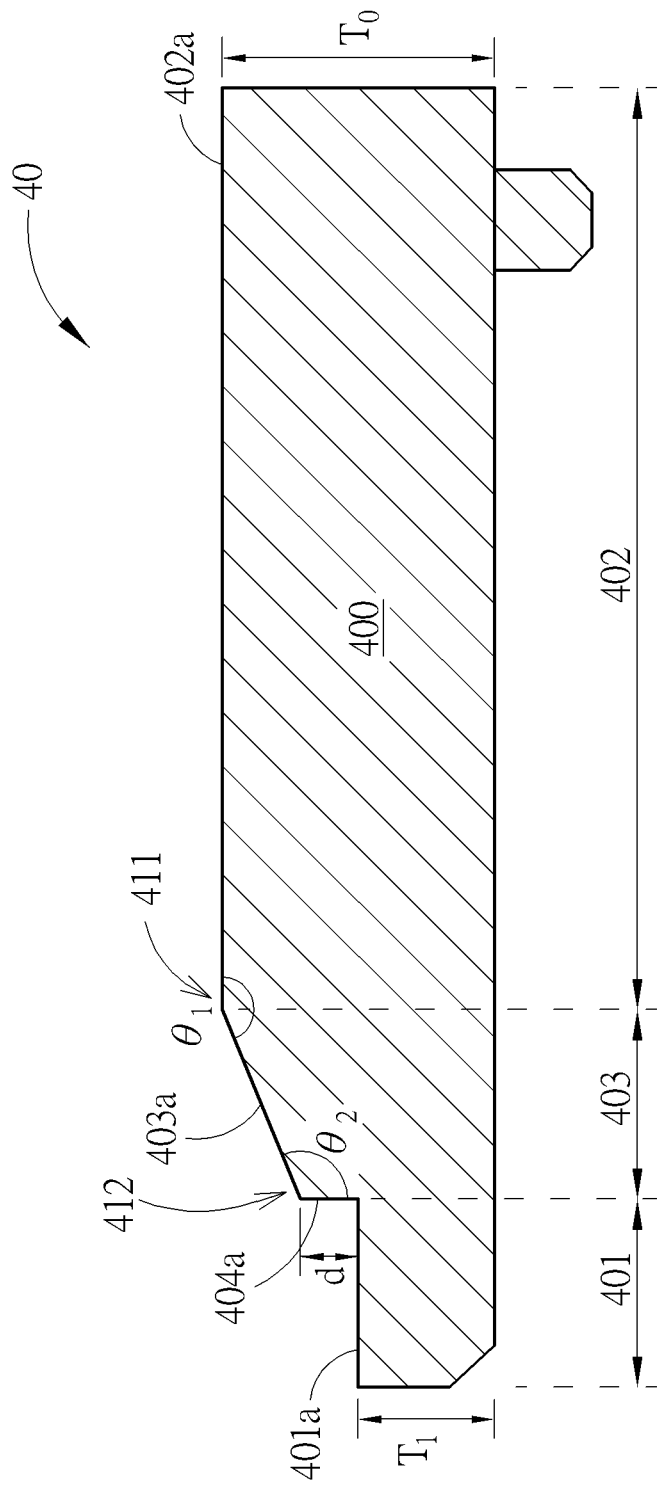
FIG. 3 is an enlarged schematic view of the carrier ring.

Please refer to FIG. 2 and FIG. 3, wherein FIG. 2 is an enlarged schematic view of the carrier ring placed on the carrier ring support surface 10b, and FIG. 3 is an enlarged schematic view of the carrier ring. As shown in FIG. 2 and FIG. 3, the carrier ring 40 is placed on the carrier ring support surface 10b, and the wafer 100 is placed on the central surface region 10a. The range of the bevel edge region 101 that slightly extends beyond the perimeter of the central surface region 10a corresponds to the annular wafer support region 401 and the lower carrier ring surface 401a.

When the deposition reaction is performed, the lower carrier ring surface 401a does not directly contact the bevel edge region 101, and at this point, the entire slope 403a may be lower than the top surface 100a of the wafer 100. When it is necessary to move the wafer 100 to the next chamber, a delivery device (not shown), for example, a spider fork, will protrude below the carrier ring 40 and raise the carrier ring 40 such that the lower carrier ring surface 401a directly contacts the bevel edge region 101 of the wafer 100 and holds the wafer 100. At this point, the slope 403a may be slightly higher than the top surface 100a of the wafer 100.

According to an embodiment of the invention, the thickness of the wafer 100 is, for example, 0.775 mm. According to an embodiment of the invention, the slope 403a of the annular transition region 403 inclines from the top carrier ring surface 402a toward the lower carrier ring surface 401a. According to an embodiment of the invention, between the slope 403a and the lower carrier ring surface 401a, there is a step height d, wherein the step height d may range between 0.3 mm and 0.6 mm.

Moreover, in accordance with an embodiment of the present invention, the thickness of the annular transition region 403 has a thickness that increases with a radius of the annular disk body 400, that is, the portion of the annular transition region 403 that is adjacent to the annular peripheral region 402 is relatively thicker, and the portion near the annular wafer support region 401 is relatively thinner. According to an embodiment of the present invention, the thickness $T_0$ of the annular peripheral region 402 may be about 4.0 to 6.0 mm, for example, 4.7 mm, but is not limited thereto. According to an embodiment of the present invention, the thickness $T_1$ of the annular wafer support region 401 may be about 3.0 to 4.0 mm, for example, 3.6 mm, but is not limited thereto.

According to an embodiment of the invention, the slope 403a and the top carrier ring surface 402a are connected to a first top-face corner 411. According to an embodiment of the invention, the angle $\theta_1$ of the first top-face corner 411 is between 100° and 180°.

According to an embodiment of the invention, the carrier ring 40 further includes a sidewall surface 404a between the slope 403a and the lower carrier ring surface 401a. In accordance with an embodiment of the invention, the slope 403a and the sidewall surface 404a are connected at a second top-face corner 412. According to an embodiment of the invention, the angle $\theta_2$ of the second top-face corner 412 is between 95° and 150°. In accordance with an embodiment of the invention, a slit 420 is formed between the sidewall surface 404a and a peripheral edge 100b of the wafer 100 during processing.

An advantage of the present invention is that the annular disk body 400 of the carrier ring 40 is divided into an annular wafer support region 401, an annular peripheral region 402, and an annular transition region 403 to form a slope in close proximity to the bevel edge region 101 of the wafer 100. Such configuration can prevent the by-product of the deposition reaction from being generated on the carrier ring 40, improving the problem of the edge local defect.

Figure 4:
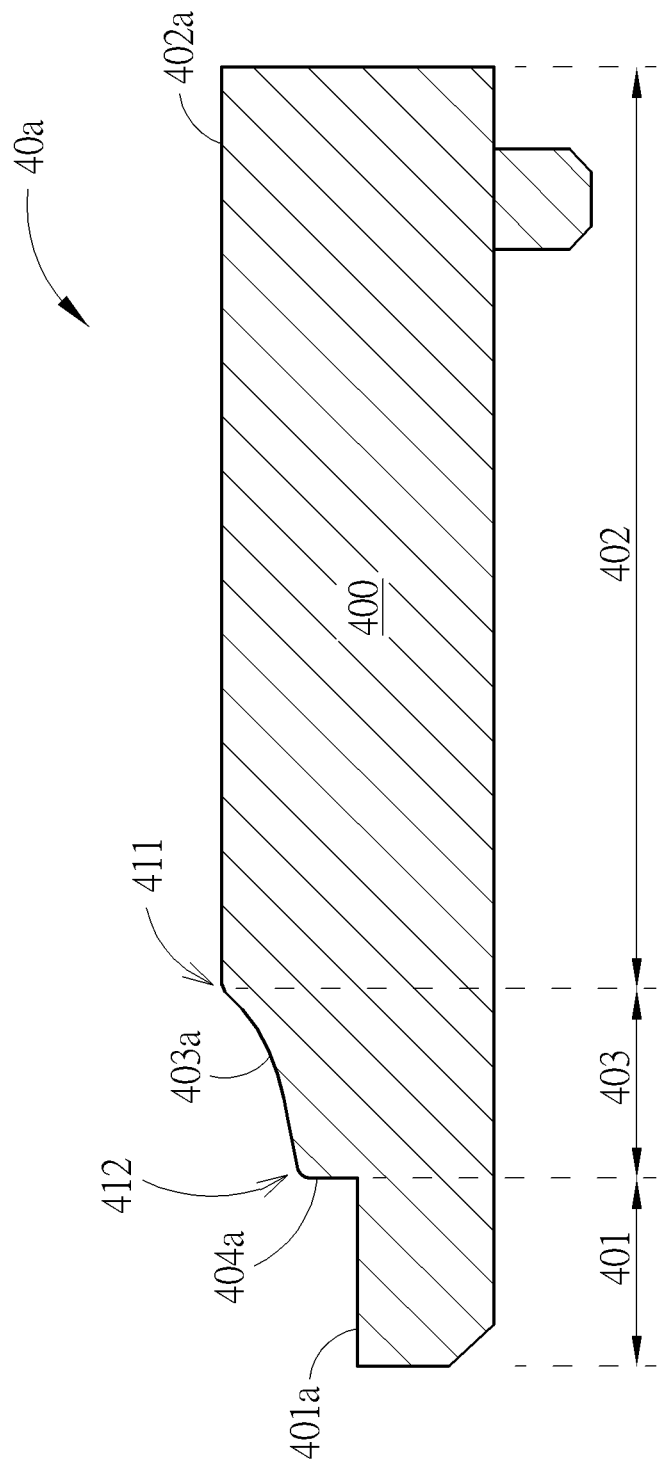
FIG. 4 is an enlarged cross-sectional view showing a carrier ring according to another embodiment of the present invention.

FIG. 4 is an enlarged cross-sectional view showing a carrier ring 40a according to another embodiment of the present invention, wherein the same elements, layers or regions are denoted by the same reference numerals. As shown in FIG. 4, the first top-facing corner 411 and the second top-facing corner 412 may be relatively rounded corner structures. Further, the slope 403a of the annular transition region 403 between the first top-facing corner 411 and the second top-facing corner 412 may be a surface with curvature or a curved surface.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chamber for processing deposition on a wafer, comprising:
   a wafer holder having a central surface region for placing a wafer and a carrier ring support surface encircling the central surface region; and a carrier ring disposed on the carrier ring support surface, the carrier ring comprising an annular disk body comprising an annular wafer support region, an annular peripheral region, and an annular transition region between the annular wafer support region and the annular peripheral region, wherein the annular peripheral region comprises a top carrier ring surface, the annular wafer support region has a lower carrier ring surface that is in physical contact with a wafer during processing, and the annular transition region comprises a curved slope between the top carrier ring surface and the lower carrier ring surface, wherein entire said curved slope is a continuously concave curved slope with its top end directly connecting to the top carrier ring surface and its bottom end directly connecting to a sidewall surface between the annular transition region and the lower carrier ring surface.

2. The chamber according to claim 1, wherein the curved slope downwardly inclines from the top carrier ring surface toward the lower carrier ring surface.

3. The chamber according to claim 1, wherein the carrier ring support surface is a step down from the central surface region.

4. The chamber according to claim 1, wherein a step height is disposed between the curved slope and the lower carrier ring surface.

5. The chamber according to claim 1, wherein the annular transition region has a thickness that increases with a radius of the annular disk body.

6. The chamber according to claim 1, wherein a slit is situated between the sidewall surface and a peripheral edge of the wafer during processing.

\* \* \* \* \*